United States Patent [19]

Hardee et al.

[11] Patent Number: 5,327,026
[45] Date of Patent: Jul. 5, 1994

[54] SELF-TIMED BOOTSTRAP DECODER

[75] Inventors: Kim C. Hardee; Kenneth J. Mobley, both of Colorado Springs, Colo.

[73] Assignees: United Memories, Inc., Colorado Springs, Colo.; Nippon Steel Semiconductor Corporation, Chiba, Japan

[21] Appl. No.: 18,802

[22] Filed: Feb. 17, 1993

[51] Int. Cl.$^5$ .................................................. H03K 17/10
[52] U.S. Cl. ..................................... 307/482; 307/449; 307/481
[58] Field of Search ............... 307/443, 449, 475, 578, 307/481–482

[56] References Cited

U.S. PATENT DOCUMENTS

| 4,570,244 | 2/1986  | Sud et al. ............... | 307/482 X |
| 4,673,829 | 6/1987  | Gupta .................... | 307/449 X |
| 4,692,638 | 9/1987  | Stiegler ................. | 307/449   |
| 5,051,959 | 1/9991  | Nakano et al. ........... | 307/449 X |
| 5,103,113 | 4/1992  | Inui et al. .............. | 307/449 X |
| 5,159,215 | 10/1992 | Muroteni ................. | 307/449   |
| 5,166,554 | 11/1992 | Reddy et al. ............. | 307/449   |

OTHER PUBLICATIONS

Toshiba TC511000/TC511001 1M×1 CMOS DRAMs, MOSAID Design Analysis Report Service, ∅∅3.7.3, 3.8.1, 3.8.2 (date unknown).

Primary Examiner—David R. Hudspeth
Attorney, Agent, or Firm—Edward D. Manzo; David K. Lucente

[57] ABSTRACT

A row decoder that includes circuitry to provide a self-timed bootstrap signal. The self-timed bootstrap signal is generated in response to the selection of the row decoder. At the same time, a capacitive device is charged in order to bootstrap a word line. The self-timed bootstrap signal causes a clock generator circuit to output a clock signal that will be used to bootstrap the word line. The self-timed bootstrap signal may be generated by other row decoders. The generation of the self-timed bootstrap signal by a row decoder is responsive to any variations in that decoder, thus always providing an accurate and precise timing of the clock signal to be used for the bootstrapping.

13 Claims, 7 Drawing Sheets

SELF-TIMED BOOTSTRAP DECODER

FIELD OF THE INVENTION

The present invention relates to an address decoder and more particularly to a DRAM row decoder with self-timed bootstrapping capabilities.

BACKGROUND OF THE PRESENT INVENTION

Typical DRAMs (dynamic random access memories) have active cycles which include access cycles for accessing the memory cells and restore cycles for restoring data read from the memory cells. Following the active cycles, typically precharge cycles occur to precharge the bit and word lines of the memory array for the next active cycle. Row decoders generally provide the circuitry to precharge the word lines and to drive the word line voltages to access and restore addressed memory cells.

A typical memory cell configuration is shown in FIG. 1. A bit line 10 is coupled to a drain electrode of a transistor 12, illustratively an n-channel, enhancement mode field effect transistor. A gate electrode of transistor 12 is coupled to or formed by part of a word line 14. A source electrode of transistor 12 is coupled to one terminal of a capacitor 16. Another terminal of capacitor 16 is coupled to a constant voltage, VCP. Bit line 10 is typically coupled to a sense amplifier circuit (not shown). Word line 14 is typically coupled to a row decoder (not shown). Generally, an array of such cells is provided.

Capacitor 16 typically is charged to VCC to store a logical "one" and 0V for a logical "zero." To read from capacitor 16, bit line 10 is typically precharged to ½ VCC and word line 14 must be driven to a voltage greater than a threshold voltage above either the voltage stored in capacitor 16 or the precharge voltage of bit line 10, whichever is lower. VCP is typically ½ VCC.

Considering a DRAM having a 5 V power supply VCC, for example, if a "zero" (0 V) is stored in capacitor 16, word line 14 must be driven to at least one threshold voltage ($\approx 1$ V) to turn transistor 12 on. If a "one" is stored in capacitor 16 (5 V), then the word line 14 must be driven to at least one threshold voltage greater than the precharge voltage of bit line 10. If bit line 10 is precharged to 2.5 V (½ VCC), then the word line should typically be charged to at least approximately 3.5 V.

After the memory cell is accessed and read, the data will be restored. In this case, word line 14 will be driven to a voltage that is at least one threshold voltage greater than VCC (5 V) to allow a full VCC (5 V) to be stored in capacitor 16 from bit line 10. Providing a voltage that is greater than the chip power supply is commonly done by the "bootstrapping" technique, well-known to the art.

Typically, when a 5 V DRAM is in an active cycle, word line 14 is driven as quickly as possible to VCC (5 V) for reading the memory cell. After the memory cell is read, the word line 14 is bootstrapped to a threshold voltage greater than VCC (5 V) for the restore cycle. Since the bootstrapping of word line 14 is not done during the critical access time of the memory cell, the timing of the bootstrapping is not critical. The timing that determines when word line 14 is driven from VCC to a voltage above VCC of the 5 V DRAM is typically generated by a conventional timer circuit that is not part of the row decoder configuration.

Progress has brought about decreased device sizes and geometries, and increased chip density. Typically, the smaller device size will not operate with a chip power supply of 5 V because it would damage the device. Therefore, these smaller devices use a lower power supply voltage, such as 3 V.

A memory cell like that shown in FIG. 1 for a 3 V DRAM would have bit line 10 precharged to 1.5 V (½ VCC). The voltage on capacitor 16 for a logic "one" will be 3 V (VCC). To read the logic "one" from capacitor 16, word line 14 must be driven to a voltage that is a threshold voltage greater than the precharged bit line voltage. To insure reliable reading of the memory cell, the word line voltage should be driven to approximately a full VCC (3 V).

An access time problem arises from these smaller device sizes of a 3 V DRAM that the 5 V DRAM may not have. The resistor-capacitor ("RC") characteristic of word line 14 causes a delay in word line 14 being driven to 3 V to read the memory cells. This delay may be seven or eight nanoseconds, and this is critical to access times. To overcome this delay problem, word line 14 is bootstrapped to a voltage greater than VCC, which shall be referred to as VCCP, to read the memory. One way to bootstrap word line 14 to VCCP is to use p- and n-channel transistors coupled to word line 14. VCCP may be provided by an on-chip charge pump. The p-channel transistor would have its source electrode coupled to VCCP, the drain electrode coupled to the word line 14, and the gate electrode coupled responsively to some internal signal within the row decoder (not shown). The n-channel transistor would have its drain coupled to word line 14, its source coupled to ground, and its gate coupled to some signal generated by the row decoder (not shown).

The p-channel transistor operates as a pull-up device that is turned on to pull word line 14 all the way to VCCP to read the memory cell. The transistor is then turned off after the memory cell data is read. The n-channel transistor operates as a pull-down device that is turned on to pull the word line to ground for the restore cycle. The problem with this approach is the p-channel transistor has less current drive capability than an n-channel transistor (of the same size) by approximately a factor of two. A very large p-channel transistor would have to be used to quickly drive the capacitance of word line 14.

An additional drawback to this approach is the p-channel transistor has to be laid out in a row pitch of a dynamic RAM which has very limited area. It is very difficult to lay out these p-channel transistors in the pitch and have them large enough to pull up word line 14 quickly. These transistors would consume a good deal of chip area.

FIG. 2 shows one prior art implementation of another bootstrap concept consisting of a generator 17, a predecoder 18 and a decoder 19. Generator 17 has a main input clock signal $\phi$XG. Generator 17 also has various other inputs, and it outputs a master clock signal $\phi$X+. Master clock signal $\phi$X+ is boosted to VCCP to boost eventually a word line signal WL (an output from decoder 19) to VCCP. The various other inputs are used, for example, to reset master clock signal $\phi$X+ low, precharge generator 17, boost a node in generator 17 to VCCP and precharge generator 17 at the start of row address strobe ("RAS") high precharge periods.

Predecoder 18 receives, among other signals, a clock signal $\phi XDP\backslash$ to precharge circuitry in predecoder 18 to a high state, master clock signal $\phi X+$ and address bits which are used to enable the output of a predecoded boosted clock signal $\phi X+_i$. The variable i represents, for example, an integer between 1 and 8. Predecoded boosted clock signal $\phi X+_i$ is boosted to VCCP, and is eventually supplied to a word line signal WL that corresponds to the variable.

Decoder 19 receives predecoded boosted clock signal $\phi X+_i$ clock signal $\phi XDP\backslash$ to precharge circuitry in decoder 19 to a high state, and address bits to enable the output of word line signal WL. Word line signal WL is raised to VCCP when main input clock signal $\phi XG$ is active.

The drawback of the FIG. 2 implementation is that the wordline signal WL rises to VCCP after input signal $\phi XG$ becomes active. In an implementation such as FIG. 2, the wordline signal WL may be quite tardy in rising to VCCP. This brings about an unnecessary delay in restoring, refreshing and/or accessing the memory cells.

Another way to bootstrap a word line of a memory array to VCCP is to use a bootstrap decoder with either internal or external timing circuitry. The timing circuitry is designed with predetermined delays. The predetermined delays are usually determined from empirical data for the bootstrapping decoders. The timing circuit is usually implemented using inverters or RC time constant delay circuits.

This later approach has many drawbacks. The timing is not accurate for each decoder circuit i.e. the decoder circuit may or may not be ready to output a word line signal WL having a voltage VCCP when it is selected. In fact, the timing is usually delayed longer than need be for the sake of reliability. Also, the timing circuit does not provide compensation for temperature variations of the devices.

Therefore, it is the general object of the present invention to overcome the above-described problems.

Another object of the present invention is to provide a simple design to implement self-timing of the decoder circuit.

SUMMARY OF THE PRESENT INVENTION

The present invention provides a self-timed bootstrap decoder circuit. The circuit includes row decoders having bootstrap drivers. A self-timed signal is generated by the row decoders. The self-timed signal is used by a clock signal generating circuit to timely provide the bootstrap voltage to the row decoder. The row decoder then provides the bootstrap voltage to a selected word line to access or restore a memory cell.

A novel and important aspect of the present invention is the provision of a self-timed signal that allows the bootstrapping of a word line in a very short period of time after a bootstrap driver is fully charged.

A salutary aspect of the present invention is that the self-timed signal is one signal that can be generated by any of the row decoder circuits.

BRIEF DESCRIPTION OF THE DRAWINGS

The invention, together with its objects and the advantages thereof, may best be understood by reference to the following detailed description taken in conjunction with the accompanying drawings with which.

DETAILED DESCRIPTION OF THE PREFERRED EMBODIMENT

Figure 1:
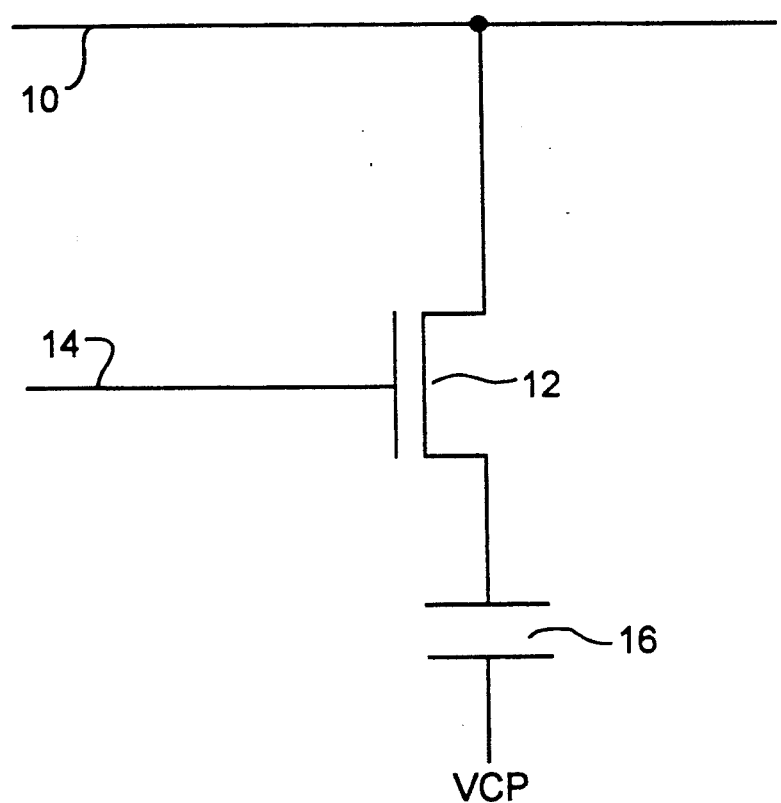
FIG. 1 is a diagram of a conventional memory cell.
Figure 2:
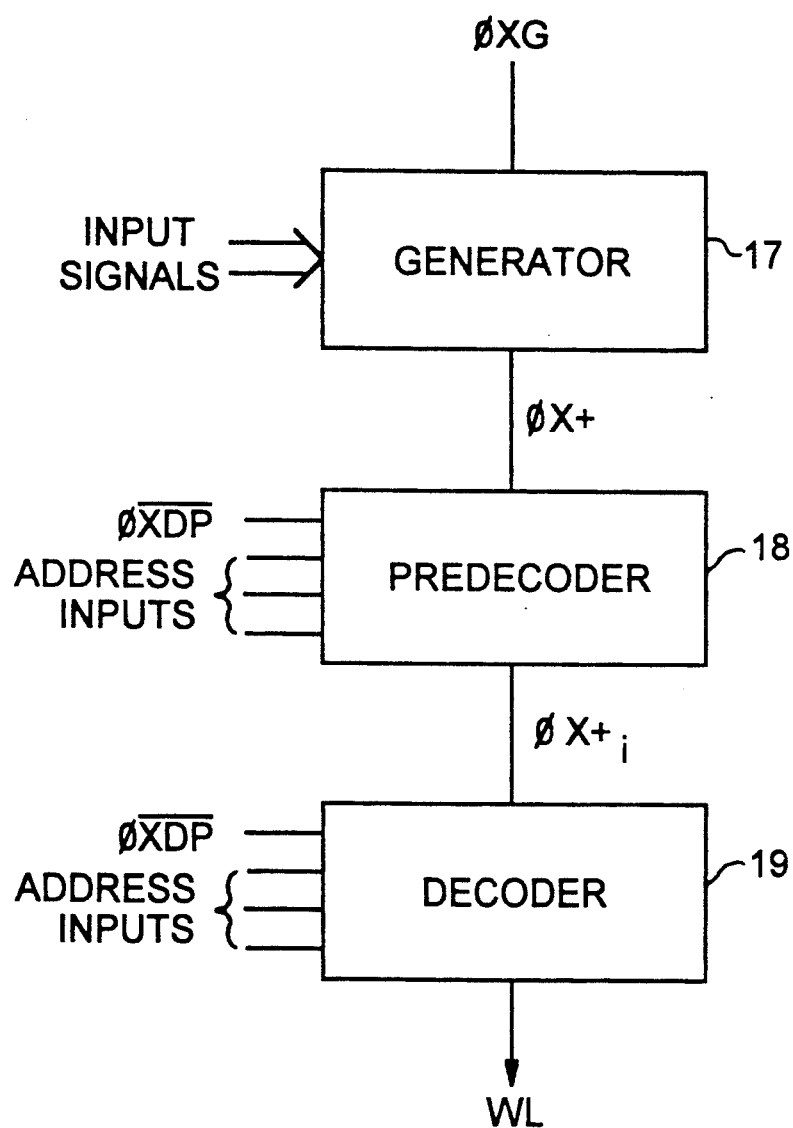
FIG. 2 is a block diagram of a prior art address decoder and clock generation circuit
Figure 3:
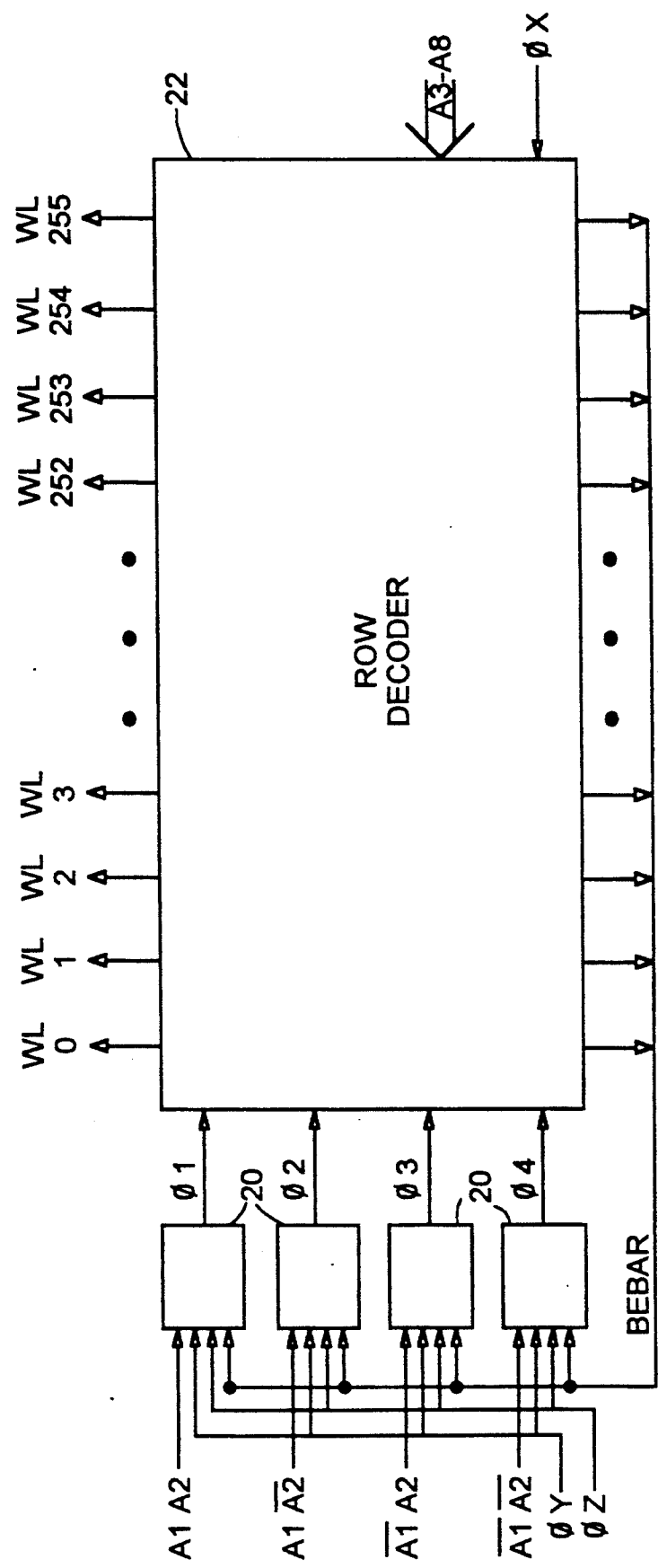
FIG. 3 is a block diagram of circuitry according to some aspects of the present invention.

FIG. 3 is a block diagram of the preferred embodiment of the present invention. Clock generators 20 are coupled to receive address signals generated from address bits A1 and A2, and clock signals $\phi Y$ and $\phi Z$. Clock generators 20 are also coupled to receive a bootstrap enable signal BEBAR from a row decoder circuit 22. Row decoder circuit 22 is coupled to receive signals $\phi 1-\phi 4$ from clock generators 20. Row decoder circuit 22 is also coupled to receive address signals generated from address bits A3-A8 and a clock signal $\phi X$. Row decoder circuit 22 selectively outputs a plurality of word line signals WL0-WL255 to a memory array (not shown).

A brief explanation of the operation of the FIG. 3 embodiment is as follows. In precharge mode, the address signals generated from address bits A1-A8 are all forced low. Then, clock signal $\phi Y$ in its low state is coupled to clock generators 20 to force clock signals $\phi 1-\phi 4$ low. This in turn drives word line signals WL0-WL255 low. Next, clock signal $\phi X$ is provided low to precharge row decoder circuit 22. The precharged row decoder circuit 22 continues to hold word line signals WL0-WL255 low. Finally, clock signal $\phi Z$ is provided low to force bootstrap enable signal BEBAR high.

In memory access mode, clock signals $\phi X$, $\phi Y$ and $\phi Z$ are provided high. An address signal generated from address bits A1 and A2 is provided high to select its respective clock generator 20. An address signal generated from address bits A3-A8 is provided high to select its respective row decoder(s) of row decoder circuit 22. Bootstrap enable signal BEBAR is driven low, which causes the selected clock generator 20 to output its respective clock signal $\phi 1$, $\phi 2$, $\phi 3$ or $\phi 4$ high. High clock signal $\phi 1$, $\phi 2$, $\phi 3$ or $\phi 4$ is provided to more than one row decoder of row decoder circuit 22 to drive high the associated word line of word line signals WL0-WL255.

Figure 4:
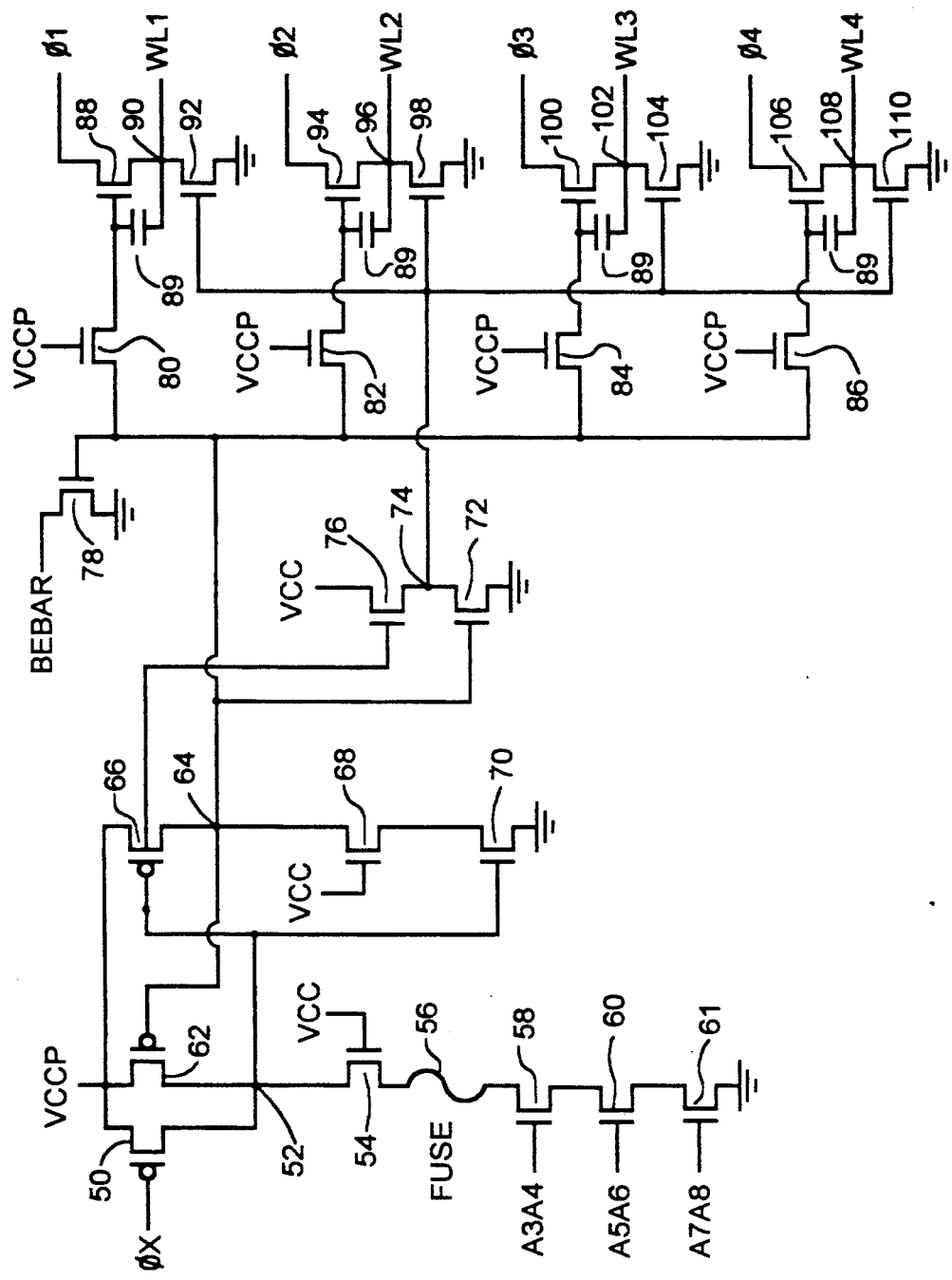
FIG. 4 is a detailed schematic diagram of the row decoders of the FIG. 3 embodiment.

FIG. 4 is a detailed schematic diagram of a row decoder 22 of FIG. 3. The inputs to FIG. 4 are clock signal $\phi X$, address signals A3A4, A5A6, A7A8, voltages VSS, VCC, and VCCP, and clock signals $\phi 1-\phi 4$. Address signals A3A4, A5A6, and A7A8 are logical combinations of address bits A3 and A4, A5 and A6, and A7 and A8, respectively. The outputs of FIG. 4 are signals WL1-WL4 and bootstrap enable signal BEBAR.

In FIG. 4, a source electrode of a transistor 50 is coupled to a first power supply. The first power supply provides a voltage VCCP, for example 5 V. A drain electrode of transistor 50 is coupled to a node 52. A gate electrode of transistor 50 is coupled to receive a clock signal $\phi X$. Node 52 is coupled to a drain electrode of a transistor 54. A source electrode of transistor 54 is coupled via a fuse and the source-drain paths of a series of transistors to ground. More specifically, the source of FET 54 is coupled to a first terminal of a fuse 56. A gate electrode of transistor 54 is coupled to a second power supply. The second power supply provides a voltage VCC, for example 3 V. A second terminal of fuse 56 is coupled to a drain electrode of a transistor 58. A source electrode of transistor 58 is coupled to a drain electrode of a transistor 60. A gate electrode of transistor 58 is coupled to receive an address signal A3A4. A source electrode of transistor 60 is coupled to a drain electrode of a transistor 61. A gate electrode of transistor 60 is coupled to receive an address signal A5A6. A source electrode of transistor 61 is coupled to a third power supply. The third power supply provides a voltage VSS, for example 0 V. A gate electrode of transistor 61 is coupled to receive an address signal A7A8.

Transistors 62, 66, 68, 70, 72, 76, 78, 80, 82, 84, 86, 88, 92, 94, 98, 100, 104, 106 and 110 comprise a word line driver circuit which used a decoded node 52 to drive a selected word line. The inputs to the word line driver circuit are node 52, voltages VSS, VCC and VCCP, and clock signals $\phi1$–$\phi4$. The outputs are BEBAR and word line signals WL1–WL4.

A source electrode of a transistor 62 is coupled to the first power supply. A drain electrode of transistor 62 is coupled to node 52. A gate electrode of transistor 62 is coupled to a node 64. Node 64 is coupled to a drain electrode of a transistor 66. A source electrode of transistor 66 is coupled to the first power supply (VCCP). A gate electrode of transistor 66 is coupled to node 52.

Node 64 is selectively coupled to ground via the source-drain paths of a pair of transistors 68, 70. Node 64 is coupled to the drain electrode of a transistor 68. A gate electrode of transistor 68 is coupled to the second power supply (VCC). A source electrode of transistor 68 is coupled to a drain electrode of transistor 70. A gate electrode of transistor 70 is coupled to node 52. A source electrode of transistor 70 is coupled to the third power supply (VSS).

Node 64 is coupled to a gate electrode of a transistor 72. A source electrode of transistor 72 is coupled to the third power supply. A drain electrode of transistor 72 is coupled to a node 74. Node 74 is coupled to a source electrode of a transistor 76. A drain electrode of transistor 76 is coupled to the second power supply. A gate electrode of transistor 76 is coupled to node 52. Node 64 is coupled to a gate electrode of a transistor 78. A source electrode of transistor 78 is coupled to the third power supply. A drain electrode of transistor 78 provides a bootstrap enable signal BEBAR (explained infra). Node 64 is coupled further to first terminals of respective source-drain paths of transistors 80, 82, 84 and 86.

A second terminal of the source-drain path of transistor 80 is coupled to a gate electrode of a transistor 88. A drain electrode of transistor 88 is coupled to receive a signal $\phi1$. A source electrode of transistor 88 is coupled to a node 90. A signal WL1 is provided as output from node 90. Node 90 is coupled to a drain electrode of a transistor 92. A source electrode of transistor 92 is coupled to the third power supply. A gate electrode of transistor 92 is coupled to node 74. This configuration is repeated for the further transistors which receive signals $\phi2$, $\phi3$ and $\phi4$ and provide outputs WL2, WL3, and WL4 respectively.

Thus, a second terminal of the source-drain path of transistor 82 is coupled to a gate electrode of transistor 94. A drain electrode of transistor 94 is coupled to receive a signal $\phi2$. A source electrode of transistor 94 is coupled to a node 96. A signal WL2 is provided at node 96. A node 96 is coupled to a drain electrode of a transistor 98. A source electrode of transistor 98 is coupled to the third power supply. A gate electrode of transistor 98 is coupled to node 74.

A second terminal of the source-drain path of transistor 84 is coupled to a gate electrode of a transistor 100. A drain electrode of transistor 100 is coupled to receive a signal $\phi3$. A source electrode of transistor 100 is coupled to a node 102. A signal WL3 is provided at node 102. Node 102 is coupled to drain electrode of a transistor 104. A source electrode of transistor 104 is coupled to the third power supply. A gate electrode of transistor 104 is coupled to node 74.

A second terminal of the source-drain path of transistor 86 is coupled to a gate electrode of a transistor 106. A drain electrode of transistor 106 is coupled to receive a signal $\phi4$. A source electrode of transistor 106 is coupled to a node 108. A signal WL4 is provided at node 108. Node 108 is coupled to a drain electrode of a transistor 110. A source electrode of transistor 110 is coupled to the third power supply. A gate electrode of transistor 110 is coupled to a node 74.

Thus, it will be seen that node 74 is coupled to gate electrodes of trnasistors 92, 98, 104 and 110 the source-drain paths of which selectively couple to the third power supply (VSS) the nodes 90, 96, 102, and 108 from which outputs WL1, WL2, WL3, and WL4 are taken. It will be noted too that the signal BEBAR outputted by circuit 22 of FIG. 4 is not unique to any single word line signal WL1 to WL4 in the preferred embodiment.

Figure 5:
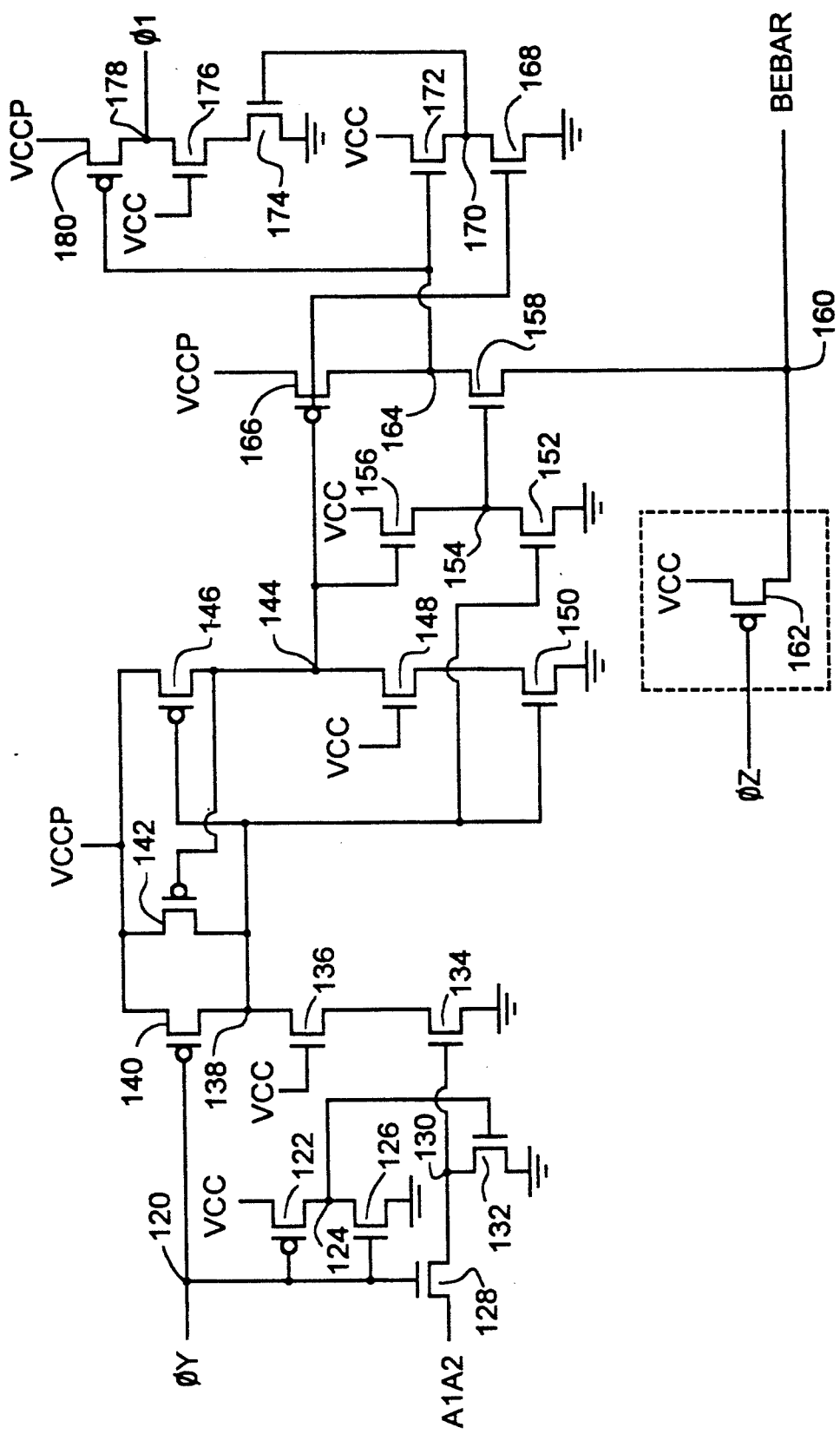
FIG. 5 is a detailed schematic diagram of the clock generators of the FIG. 3 embodiment.

FIG. 5 is a detailed schematic diagram of a clock generator 20 of FIG. 3. The inputs to FIG. 5 are clock signals $\phi Y$ and $\phi Z$, voltages VSS, VCC and VCCP, address signal A1A2 and bootstrap enable signal BEBAR. The output of FIG. 5 is clock signal $\phi1$. The FIG. 5 circuit generates clock signal $\phi1$ of FIGS. 3 and 4. An output node 120 is coupled to receive a clock signal $\phi Y$. Input node 120 is coupled to a gate electrode of a transistor 122. A source electrode of transistor 122 is coupled to the second power supply (VCC). A drain electrode of transistor 122 is coupled to a node 124. Node 124 is coupled to a drain electrode of a transistor 126. A source electrode of transistor 126 is coupled to the third power supply. A gate electrode of transistor 126 is coupled to input node 120.

Input 120 is coupled to a gate electrode of a transistor 128. A first terminal of a source-drain path of transistor 128 is coupled to receive an address signal A1A2. A second terminal of source-drain path of transistor 128 is coupled to a node 130. Node 130 is coupled to a drain electrode of a transistor 132. A source electrode of transistor 132 is coupled to the third power supply. A gate electrode of transistor 132 is coupled to node 124.

Node 130 is coupled to a gate electrode of a transistor 134. A source electrode of transistor 134 is coupled to the third power supply. A drain electrode of transistor 134 is coupled to a source electrode of a transistor 136. A gate electrode of transistor 136 is coupled to the second power supply. A drain electrode of transistor 136 is coupled to a node 138.

Node 138 is coupled to a drain electrode of a transistor 140. A gate electrode of transistor 140 is coupled to input node 120. A source electrode of transistor 140 is coupled to the first power supply. A source electrode of a transistor 142 is coupled to the first power supply (VCC). A drain electrode of transistor 142 is coupled to node 138. A gate electrode of transistor 142 is coupled to a node 144. A source electrode of a transistor 146 is coupled to the first power supply. A gate electrode of transistor 146 is coupled to node 138. A drain electrode of transistor 146 is coupled to node 144. Substrates of transistors 140, 142 and 146 are coupled to the first power supply.

Node 144 is coupled to a drain electrode of a transistor 148. A gate electrode of transistor 140 is coupled to the second power supply (VCC). A source electrode of transistor 148 is coupled to a drain electrode of a transistor 150. A source electrode of transistor 150 is coupled to the third power supply. A gate electrode of transistor 150 is coupled to node 138.

Node 138 is coupled to a gate electrode of a transistor 152. A source electrode of transistor 152 is coupled to the third power supply. A drain electrode of transistor 152 is coupled to a node 154. Node 154 is coupled to a source electrode of a transistor 156. A gate electrode of transistor 156 is coupled to node 144. A drain electrode of transistor 156 is coupled to the second power supply.

Node 154 is coupled to a gate electrode of a transistor 158. A source electrode of transistor 158 is coupled to a node 160. Node 160 is coupled to a drain electrode of a transistor 162. A gate electrode of transistor 162 is coupled to receive a clock signal $\phi Z$. A source electrode of transistor 162 is coupled to the second power supply. Node 160 is coupled to receive a bootstrap enable signal BEBAR from transistor 78 in FIG. 4.

A drain electrode of transistor 158 is coupled to a node 164. Node 164 is coupled to a drain electrode of a transistor 166. A gate electrode of transistor 166 is coupled to node 144. A source electrode of transistor 166 is coupled to the first power supply. A substrate of transistor 166 is further coupled to the first power supply. Node 144 is coupled to a gate electrode of a transistor 168. A source electrode of transistor 168 is coupled to the third power supply. A drain of transistor 168 is coupled to a node 170. Node 170 is coupled to a source electrode of a transistor 172. A gate electrode of transistor 172 is coupled to node 164. A drain electrode of transistor 172 is coupled to the second power supply.

Node 170 is coupled to a gate electrode of a transistor 174. A source electrode of transistor 174 is coupled to a third power supply. The drain electrode of transistor 174 is coupled to the source electrode of a transistor 176. A gate electrode of transistor 176 is coupled to the second power supply. A drain electrode of transistor 176 is coupled to an output node 178. The clock signal $\phi 1$ is provided at output node 178. Node 178 is coupled to a drain electrode of a transistor 180. A source electrode of transistor 180 is coupled to the first power supply. A gate electrode of transistor 180 is coupled to node 164. A substrate of transistor 180 is coupled to the first power supply.

OPERATION

Figure 6:
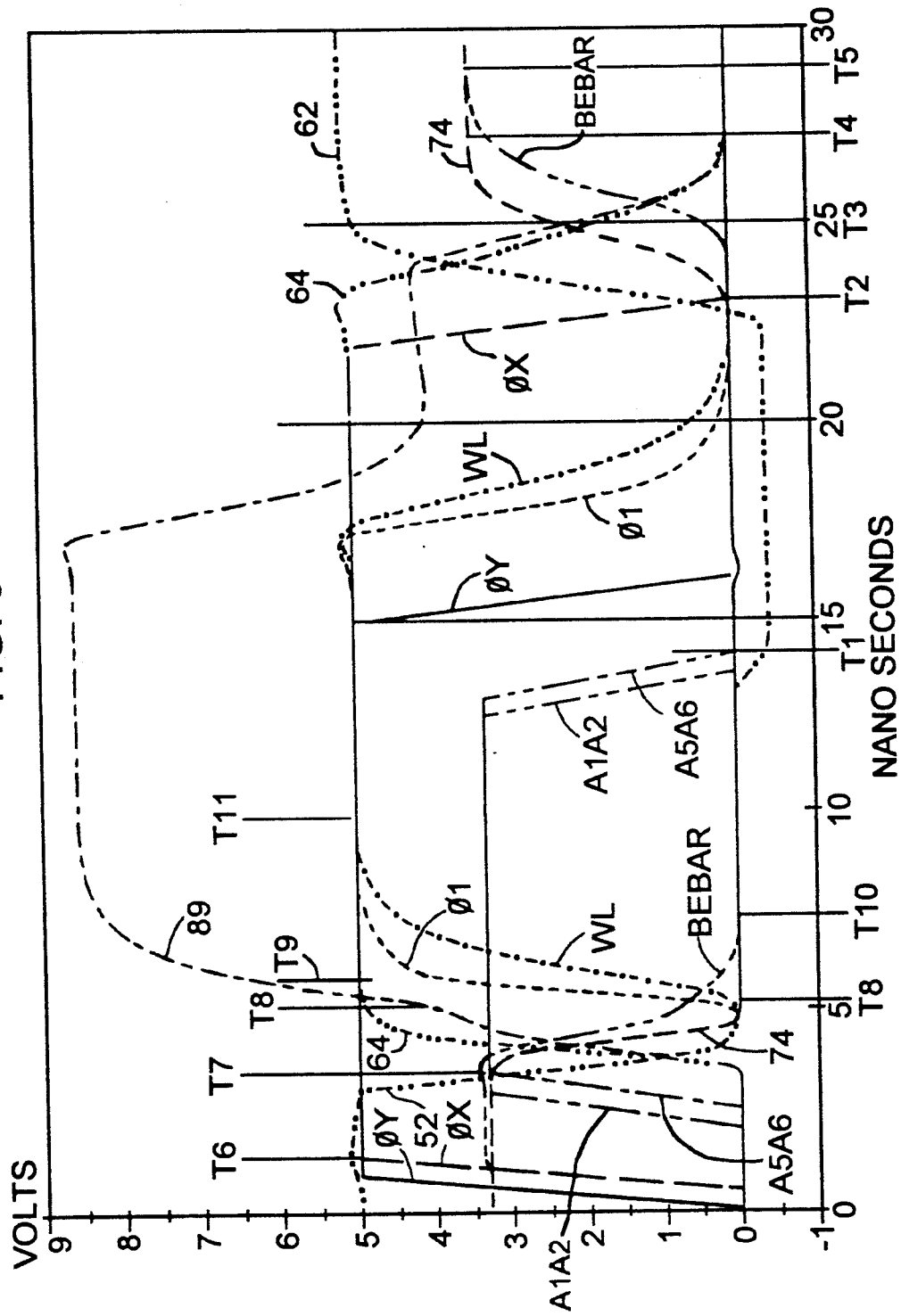
FIG. 6 is a timing diagram for the FIG. 3 circuit.

FIG. 4 and FIG. 6 will be referred to first in explaining of the operation of the FIG. 3 embodiment. FIG. 6 shows the voltage level of various signals plotted against time (nanoseconds). During precharge of row decoders 22, address signals A3A4, A5A6 and A7A8 are low (only address A5A6 is shown in T1 in FIG. 6, signals A3A4 and A7A8 are substantially the same as signal A5A6) to turn transistors 58, 60 and 61 off. (Since these three transistors are series connected if even one of them is off, that suffices to block the path to ground from node 52.) Thereafter, signal $\phi X$ drops to low (T2 in FIG. 6) to turn p-channel transistor 50 on. As a result, node 52 is pulled to approximately VCCP (T3 in FIG. 6). VCCP at node 52 turns on transistor 70 and turns off transistor 66. With transistor 66 off, the path form node 64 to VCCP is blocked. Node 64 is pulled to a third voltage VSS (T4 in FIG. 6) through turned on transistors 68 and 70. VSS at node 64 causes p-channel transistor 62 to turn on. Conductive transistor 62 clamps the voltage at node 52 to VCCP. Transistor 62 functions as a latch transistor to hold the voltage at node 52 to VCCP during other sequences of timing.

In FIG. 4, transistors 50, 62 and 66 have their substrates coupled to the first power supply (VCCP). This is necessary because transistors 50, 62 and 66 pull up nodes 52 and 64 to a high voltage VCCP (for example 5 V). If the substrates of transistors 50, 62 and 66 were coupled to VCC (for example 3 V), the voltage VCCP at nodes 52 and 60 would cause a positive voltage drop between the drain electrodes of transistors 50, 62 and 66, and the substrates of those transistors during power-up. Transistors 50, 62 and 66 would then have their drain-substrate junctions forward biased. Such forward bias causes substrate current that may latch-up the transistors.

Transistors 54 and 68 are used in the preferred embodiment for reliability purposes. The gate electrodes are coupled to the second power supply to maintain n-channel transistors 54 and 68 on. Since the voltage at the gate electrodes of transistors 54 and 68 is the low voltage VCC (3 V), the voltage at the source electrodes of transistors 54 and 68 is limited to VCC-Vt, where Vt is the threshold voltage of the transistor. The voltage at the source electrode cannot increase past VCC-Vt because the transistor would turn off.

The voltage drop across both transistors 58 and 70 will not exceed VCC-Vt due to transistors 54 and 68. This is necessary because the devices of the present invention have small dimensions. If larger voltage drops were allowed, then transistors 58 and 70 would become unreliable during switching because of hot carrier injection and substrate current.

VSS at node 64 turns off transistor 72 to isolate node 74 from ground. VCCP at node 52 is provided to and turns on transistor 76. When on, transistor 76 clamps the voltage at node 74 to VCC (T4 in FIG. 6).

VSS at node 64 is provided to the first terminals of transistors 80, 82, 84 and 86. Transistors 80, 82, 84 and 86 are on since the voltage at their respective gate electrodes is VCCP. VSS at node 64 is passed through the source-drain paths of transistors 80, 82, 84 and 86 to the gate electrodes of n-channel transistors 88, 94, 100 and 106 respectively. Transistors 88, 94, 100 and 106 are thus turned off to isolate nodes 90, 96, 102 and 108 from respective clock signals $\phi 1$–$\phi 4$. Also, with node 64 at VSS, n-channel transistor 78 is off so that BEBAR is not pulled to ground therethrough (T5 in FIG. 6). In fact, prior to time T3 in FIG. 6, bootstrap enable signal BEBAR starts to rise. This is due to clock signal $\phi Z$ (FIG. 5) changing to a low state (as explained supra).

VCC at node 74 is provided to and turns on transistors 92, 98, 104 and 110. When on, transistors 92, 98, 104 and 110 clamp respective nodes 90, 96, 102 and 108 to the third power supply (VSS). The signals WL1–4 are output having a low voltage (T5 in FIG. 6) thereby to preferably avoid accessing the memory cells. Before T2 in FIG. 6, signal WL1 is low because WL1 followed clock signal $\phi 1$, which was decreasing then.

When the memory device is to be accessed, clock $\phi X$ is driven to VCCP (T6 in FIG. 6) to turn off transistor 50. Next, predecoding circuitry, which is preferably on-chip, brings to the active state (high) the address signals A3A4, A5A6 and A7A8. Signal A5A6 is shown at T7 in FIG. 6; A5A6 and A7A8 change at about the same time. Address signals A3A4, A5A6 and A7A8 are driven to VCC to turn on transistors 58, 60 and 61. If fuse 56 is not blown, the voltage at node 52 is pulled to ground (T8 in FIG. 6). However, due to timing delays, transistor 62 is contending with transistors 54, 58 and 60 since it is still on, and is pulling the voltage at node 52 to VCCP. This contention is eliminated since it is preferred that transistors 54, 58 and 60 in series have greater current driving capabilities than transistor 62. Transistor 62 is therefore overdriven by transistors 54, 58 and 60, and the voltage at node 52 is pulled to VSS.

VSS at node 52 turns off transistors 70 and 76 and turns on transistor 66. Off transistor 70 decouples node 64 from the third voltage supply. On transistor 66 pulls node 64 to VCCP (T9 in FIG. 6). VSS at node 52 turns off transistor 76 to further aid in the decoupling of node 74 from VCC. VCCP at node 64 turns on transistor 72 to clamp node 74 to the third voltage supply. Recall that node 74 is already decreasing to VSS before T8. This is because prior to T8 in FIG. 6, the voltage at node 52 is decreasing which quickly turns off transistor 76 to decouple and decrease the voltage at node 74 from VCC. Likewise, at about the same time, the voltage at node 64 is increasing to quickly turn on transistor 72 to clamp node 74 to VSS. VSS at node 74 turns off transistors 92, 98, 104 and 110 to decouple nodes 90, 96, 102 and 108 from the third power supply.

VCCP at node 64 is provided to the first terminals of transistors 80, 82, 84 and 86. Current will flow through transistors 80, 82, 84 and 86 since their respective gate electrodes have a high voltage VCCP and their second terminals have a voltage of about 0 V. The current charges the parasitic capacitances 89 between the gate and source electrodes of transistors 88, 94, 100 and 106. The parasitic capacitances 89 will each be charged to a voltage VCCP-Vt (at approximately T8 in FIG. 6), which will be the voltage at the gate electrode of transistors 88, 94, 100 and 106.

The voltages at nodes 90, 96, 102 and 108 are 0 V (prior to T8 in FIG. 6) which is the precharge state. The voltage drop between the gate and source electrodes of transistors 88, 94, 100 and 106 is VCCP-Vt. Transistors 88, 94, 100 and 106 are turned on to couple nodes 90, 96, 102 and 108 to receive clock signals $\phi 1-\phi 4$ respectively.

VCCP at node 64 turns on transistor 78 to couple the terminal providing bootstrap enable signal BEBAR to the third power supply. This causes bootstrap enable signal BEBAR to be pulled active to VSS (T10 in FIG. 6). The active bootstrap enable signal BEBAR causes clock generators 20 of FIG. 3 to generate at least one of clock signals $\phi 1-\phi 4$. It will be understood that preferably active address signals A3A4, A5A6 and A7A8 cause bootstrap enable signal BEBAR to become active (low) (T8 in FIG. 6) and parasitic capacitances 89 to be charged fully (T8 in FIG. 6). This in turn allows one of the clock signals $\phi 1-\phi 4$ to be provided in its active state (high) to one of transistors 88, 94, 102 or 108 after parasitic capacitances 89 have charged.

It is critical that parasitic capacitances 89 be charged up (T8 in FIG. 6) before any of the clock signals $\phi 1-\phi 4$ become fully active (high). If any one of clock signals $\phi 1-\phi 4$ is driven high before parasitic capacitances 89 are fully charged up, the bootstrapping will not work correctly. If any of the clock signals $\phi 1-\phi 4$ is driven high later than the earliest possible time that it can, the bootstrapping will work correctly, but the access time will be increased. Word line signal WL1 follows clock signal $\phi 1$ as shown between T8 and T11 in FIG. 6.

Figure 7:
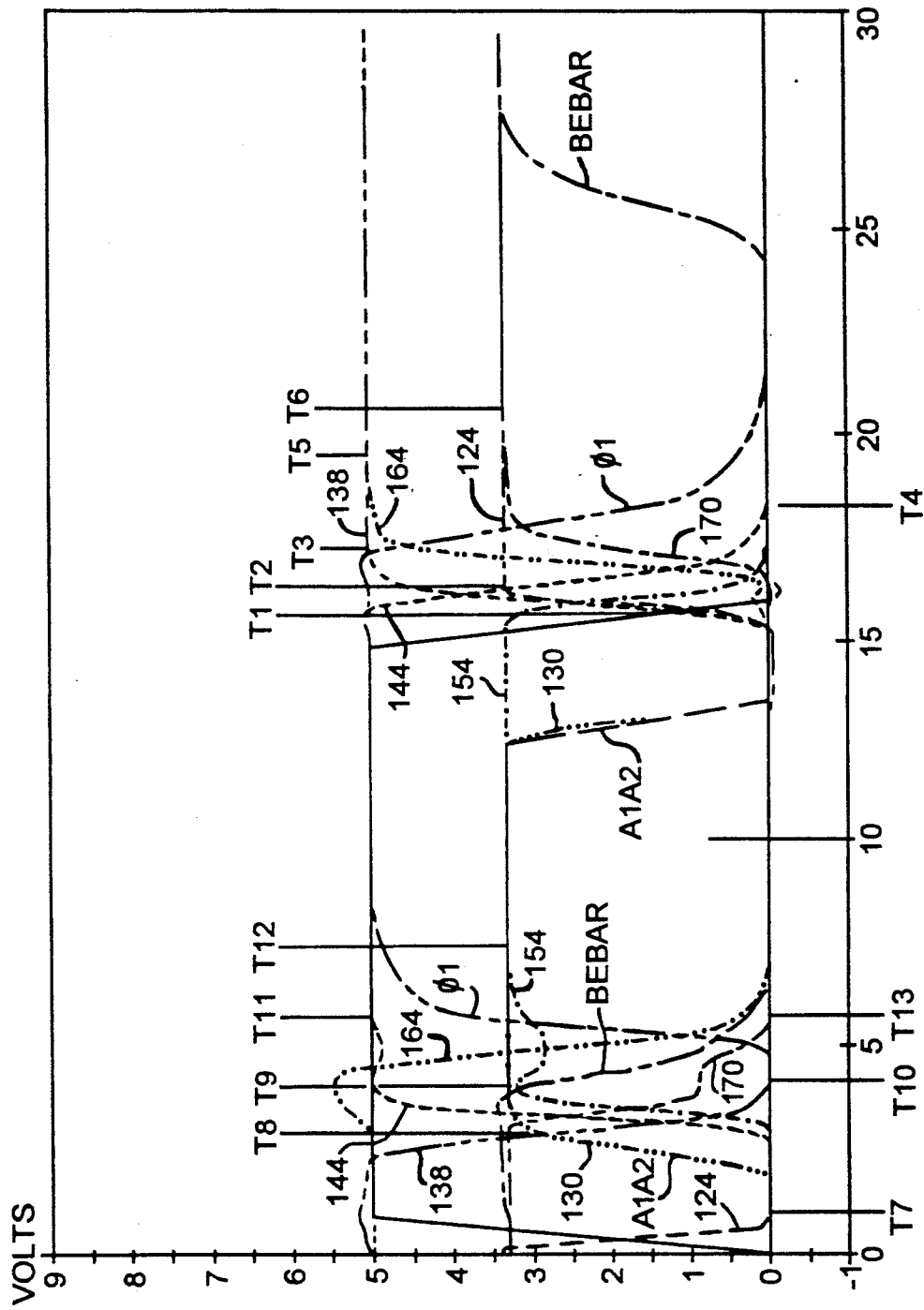
FIG. 7 is a timing diagram for the FIG. 5 circuit.

FIGS. 5 and 7 will be referenced to illustrate the generation of clock signal $\phi 1$. Like time designations in FIGS. 6 and 7 do not represent the same time designated in both figures. During the precharge cycle, address signal A1A2 and clock signals $\phi Y$ and $\phi Z$ are preferably sequentially input as VSS. Transistor 126 is turned off by signal $\phi Y$ to decouple node 124 from the third power supply (T1 in FIG. 7). Transistor 128 is turned off by clock signal $\phi Y$ to decouple address signal A1A2 from node 130.

The low clock signal $\phi Y$ turns on transistor 122 to clamp node 124 to the second power supply (T2 in FIG. 7). The voltage of node 124 is VCC which turns on transistor 132 to clamp node 130 to the third power supply. The voltage at node 130 is VSS which turns off transistor 134. Off transistor 134 decouples node 138 through on transistor 136 from the third voltage supply. Transistors 136 and 148 serve to limit the voltage drop across transistors 134 and 150, respectively.

Low clock signal $\phi Y$ turns on transistor 140 to clamp node 138 to the first power supply (T3 in FIG. 7). The voltage at node 138 will be VCCP. As the voltage at node 138 rises, it turns off transistor 146 to decouple node 144 from the first power supply. Rising node 138 turns on transistor 150 to couple node 144 through turned on transistor 148 to the third power supply (T4 in FIG. 7). VSS at node 144 turns on transistor 142 which clamps node 138 to VCCP (T5 in FIG. 7). Transistor 142 serves to latch the voltage at node 138 to VCCP.

Due to node 138 increasing to VCCP prior to T8, and node 144 decreasing to VSS at T8, transistors 152 and 159 are turned on and off, respectively. This causes the voltage at node 154 to decrease to VSS (T4 in FIG. 7). VSS at node 154 turns off transistor 158 to decouple node 160 from 164. As transistor 158 is being turned off, the voltage at node 164 increases. VSS of clock signal $\phi Z$ turns on transistor 162 to couple node 160 to the second power supply, thereby pulling up the BEBAR signal toward the inactive state.

VSS at node 144 turns on transistor 166 to couple node 164 to the first power supply (T5 in FIG. 7). Prior to T5, as nodes 144 and 154 decrease to VSS, transistor 166 is turned on to pull up node 164 to VCCP, and transistor 158 is turned off to decouple node 164 from node 160. Hence, the voltage at node 164 is increasing prior to both nodes 144 and 154 reaching VSS. VSS at node 144 turns off transistor 168 to decouple node 170 from the third power supply. VCCP at node 164 turns on transistor 172 to clamp node 170 to the second power supply (T6 in FIG. 7). Prior to T6, as transistors 168 and 172 are being turned off and on respectively, the voltage at node 170 starts to increase. Also, VCCP at node 164 turns off transistor 180 to decouple node 178, from which output signal $\phi 1$ is taken, from the first power supply.

VCC at node 170 turns on transistor 174 to couple node 178 through on transistor 176 to the third power supply. The clock signal $\phi 1$ supplied from node 178 having a voltage VSS (inactive). When the memory array is to be accessed, clock signal $\phi Y$ is driven to VCCP. The voltage VCCP of clock signal φY turns off transistor 122 to decouple node 124 from the second power supply. The voltage VCCP of clock signal φY turns on transistor 126 to clamp node 124 to the third power supply (T7 in FIG. 7). The voltage VSS at node 124 turns off transistor 132 to unclamp node 130 from the third power supply. The voltage VCCP of clock signal φY turns on transistor 128 to pass the address signal A1A2 to node 130. Address signal A1A2 is generated by a predecoder circuit (not shown), and provided to the source-drain path of transistor 128 having a voltage VCC at time T8 in FIG. 7. The voltage at node 130 rises to VCC (T9 in FIG. 7). The voltage VCCP of clock signal φY turns off transistor 140 to decouple node 138 from the first power supply. The voltage VCC at node 130 turns on transistor 134 to clamp node 138 through on transistor 136 to the third power supply (T10 in FIG. 7). Nodes 130 and 138 rise and fall, respectively, at roughly the same time as shown between times T7 and T10 of FIG. 7.

The voltage VSS at node 138 turns off transistor 150 to decouple node 144 from the third power supply through on transistor 148. The voltage VSS at node 138 turns off transistor 152 to decouple node 154 from the third power supply. The voltage VSS at node 138 turns on transistor 146 to couple node 144 to the first power supply. The voltage at node 144 increases to VCCP to turn off transistor 142. Due to transistors 134 and 136 over driving transistor 142, node 138 is clamped to VSS (T10 in FIG. 8) before node 144 is clamped to VCCP (T11 in FIG. 7).

The voltage VCCP at node 144 turns on transistor 156 to couple node 154 to the second power supply (T12 in FIG. 7). Recall that node 138 is at VSS, so transistor 152 is off. The voltage VCCP at node 144 turns off transistor 166 to decouple node 164 from the first power supply. Node 164 still maintains the voltage VCCP due to capacitances at that node. The voltage VCC at node 154 is applied to the gate electrode of transistor 158. However, transistor 158 does not turn on because it does not surpass node 160 by at least one Vtn, i.e. node 160 has a voltage VCC since BEBAR has not yet been driven (pulled) low (by FET 78 in FIG. 4).

The voltage VCCP at node 164 keeps transistor 172 on to couple node 170 to the second power supply. However, the voltage VCCP at node 144 turns on transistor 168 to couple node 170 to the third power supply also (T13 in FIG. 7). The contention to drive node 170 to both the voltage VCC and the voltage VSS is overcome by making transistor 168 larger than transistor 172. Larger transistor 168 overdrives transistor 172 to pull the voltage at node 170 to the voltage VSS. The voltage VCCP at node 164 also keeps transistor 180 off to maintain node 178 isolated from the first power supply. The voltage VSS at node 170 turns off transistor 174 to decouple node 178 from the third power supply. Thus, signal φ1 is coupled to neither the first nor the third power supplies.

The bootstrapping will now be explained with reference to FIGS. 4 and 5. In FIG. 4, transistor 78 preferably turns on while the parasitic capacitances 89 of transistors 88, 94, 100 and 106 are charged up. While charging, bootstrap enable signal BEBAR is pulled to VSS (see T7-T12 in FIG. 6).

Referring to FIG. 5, when bootstrap enable signal BEBAR is pulled low (T10 in FIG. 6), the voltage at the source electrode of transistor 158 will be VSS. Because the voltage at the gate electrode of transistor 158 is voltage VCC, transistor 158 will turn on. Node 164 will then be clamped to voltage VSS through the source-drain path of transistor 78 in FIG. 4.(Recall that transistor 166 is off).

The voltage VSS at node 164 turns off transistor 172 to decouple node 170 from the second power supply, thus removing the contention at node 170. The voltage VSS at node 164 also turns on transistor 180 to couple node 178 to the first power supply. Because of the size of transistor 180, node 178 is quickly pulled to VCCP. Clock signal φ1 is provided from node 178 having voltage VCCP (T11 in FIG. 6) to, for example, transistor 88 in FIG. 4.

Since the voltage at the gate electrode of transistor 92 in FIG. 4 is VSS (explained supra), transistor 92 is off. Node 90 is isolated from the third power supply. The voltage at the gate electrode of transistor 88 is VCCP-Vt (T8 in FIG. 6). Transistor 88 is turned on to conduct current from clock signal φ1 having voltage VCCP to node 90 (WL1 and T8 in FIG. 6). As the voltage at node 90 (φ1) starts to rise between T8 and T11 in FIG. 6, parasitic capacitance 89 capacitively couples node 90 to the gate electrode of transistor 88 and causes the voltage at such gate electrode to increase as shown between T8 and T11 in FIG. 6. The increasing voltage at the gate electrode of transistor 88 causes transistor 80 to turn off (because the voltage at the gate electrode of transistor 80 is less than one threshold voltage (Vt) greater than the increasing voltage at the gate electrode of transistor 88).

The increasing voltage at the gate electrode of transistor 88 will increase to a voltage greater than VCCP+Vtn (where Vtn is a threshold voltage for an n-channel transistor) to allow the voltage at node 90 to reach a full VCCP (provided by clock signal φ1). This high voltage will then be used to turn on the memory cell transistors (not shown) to restore or refresh a full logic "one" level in those memory cells along the row where such logic level had been stored.

The timing sequences explained above are for illustrating the operation of the preferred embodiment. Variations in the timing sequences will not depart from the scope of the present invention. However, it is preferred that the bootstrap enable signal BEBAR is provided to generate at least one of the clock signals φ1-φ4 to be provided a minimum amount of time after parasitic capacitances 89 are fully charged.

It will be understood that important aspects of this invention include generating the bootstrap enable signal BEBAR active (low), when any of the row decoders is selected, to time a corresponding selected clock generator 20 to output its respective clock signal high (VCCP) to provide proper bootstrapping of the selected word line with a minimum of wasted time.

It will be further understood that bootstrap enable signal BEBAR is preferably generated by any selected row decoder(s) in conjunction with its corresponding clock generator(s). Since any selected row decoder and corresponding clock generator generate signal BEBAR, a more precise timing is achieved to generate a corresponding word line signal WLX since temperature, device variations, etc. specific to that row decoder and clock generator contribute in generating the bootstrapping enable signal BEBAR. Accordingly, variances of the row decoders and clock generators are taken into account in precisely and accurately timing the bootstrapping.

Furthermore, the addition of transistor 78 for each row decoder and transistor 162 for each clock generator makes the preferred embodiment of the present invention easy to implement because it does not utilize complicated circuitry to generate bootstrap enable signal BEBAR. Hence, reliability and chip area are not severely compromised to enable precise timing of bootstrapping the word lines.

It should be appreciated that the foregoing description is directed to a preferred embodiment of the present invention, and that numerous modifications or alterations can be made without departing from the spirit or scope of the present invention.

What we claim as the invention is:

1. A bootstrap decoder circuit comprising:
   at least one word line driver circuit having an input for receiving at least one input signal; and
   at least one clock generator circuit coupled to said at least one word line driver circuit;
   said word line driver circuit providing a bootstrap enable signal to said at least one clock generator circuit and at least one word line signal in response to receiving sad at least one input signal;
   said at least one clock generator circuit providing, in response to the bootstrap enable signal, a clock signal to said at least one word line driver circuit,
   said at least one word line driver circuit basing said word line signal further on the clock signal.

2. The circuit of claim 1 wherein said at least one word line driver includes a bootstrap enable signal generating circuit to generate the bootstrap enable signal in response to the at least one input signal.

3. The bootstrap decoder circuit of claim 1 wherein said at least one input signal to said at least one word line driver circuit includes at least one predecoded address signal and a control clock signal.

4. The bootstrap decoder circuit of claim 1 wherein said bootstrap decoder circuit includes a plurality of said clock generator circuits each coupled to receive said bootstrap enable signal from said at least one word line driver circuit, each said clock generator circuit providing a respective clock signal for said word line driver; and
   wherein said input of said at least one word line driver circuit includes respective inputs for receiving a control clock signal, a plurality of predecoded address signals, and the clock signals provided by corresponding ones of said plurality of clock generator circuits;
   wherein said word line signal provided by said at least one word line driver circuit comprises a plurality of word line signals corresponding to said clock signals from said clock generator circuits.

5. The bootstrap circuit of claim 4 wherein said word line driver includes a plurality of output transistors, each connected to receive a respective one of said clock signals from said clock generator circuits at one terminal thereof and to provide a corresponding word line signal at a second terminal thereof.

6. The bootstrap circuit of claim 5 wherein said word line driver further includes, for each said output transistor, a corresponding first transistor coupled to a control electrode of the respective output transistor,
   wherein each said output transistor also has a parasitic capacitance between its control electrode and its second terminal.

7. The bootstrap circuit of claim 6 wherein said bootstrap decoder further includes a bootstrap enable signal output transistor coupled to provide said bootstrap enable signal and coupled to each of said first transistors.

8. The bootstrap circuit of claim 7 wherein said bootstrap enable signal output transistor is included in said word line driver circuit.

9. The bootstrap decoder circuit of claim 7 wherein each said clock generator circuit is coupled to receive a second control clock signal.

10. A bootstrap decoder circuit comprising:
    a row decoder circuit coupled to receive at least one select signal and at least one control signal, and including at least one output terminal;
    a clock generator circuit coupled to receive at least another select signal and at least another control signal, and including at least another output terminal; and
    a bootstrap enable signal circuit coupled to said row decoder circuit and said clock generator circuit, said bootstrap enable signal circuit generating a bootstrap signal in response to the at least one select signal, said clock generator circuit generating a clock signal in response to the bootstrap signal and providing the clock signal at the at least another output terminal, and said row decoder circuit generating a word line signal in response to the clock signal, the word line signal being output from the at least one output terminal.

11. The circuit of claim 10 wherein said bootstrap enable signal includes a switch.

12. A method of operating a bootstrap decoder circuit comprising the steps of:
    charging at least one capacitance device in response to at least one select signal;
    generating at least one bootstrap enable signal in response to the at least one select signal at substantially a same time as the preceding step;
    generating at least one clock signal in response to the at least one bootstrap signal; and
    generating at least one word line signal in response to the at least one clock signal, the at least one clock signal being timely provided in response to the at least one bootstrap signal at substantially a same time that the at least one capacitance device is fully charged.

13. The method of claim 12 further comprising the step of precharging the bootstrap decoder circuit in response to at least one control signal.

* * * * *